United States Patent
Kim et al.

(10) Patent No.: US 10,770,516 B2
(45) Date of Patent: Sep. 8, 2020

(54) SELF-LIGHT EMITTING DISPLAY DEVICE

(71) Applicant: LG Display Co., Ltd., Seoul (KR)

(72) Inventors: Wonrae Kim, Paju-si (KR); Seungbum Lee, Gimpo-si (KR); Sooin Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/593,415

(22) Filed: Oct. 4, 2019

(65) Prior Publication Data

US 2020/0111842 A1 Apr. 9, 2020

(30) Foreign Application Priority Data

Oct. 5, 2018 (KR) .................. 10-2018-0118872

(51) Int. Cl.
*H01L 27/32* (2006.01)
*H01L 51/52* (2006.01)

(52) U.S. Cl.
CPC ........ *H01L 27/322* (2013.01); *H01L 27/3246* (2013.01); *H01L 27/3283* (2013.01); *H01L 51/5268* (2013.01); *H01L 51/5271* (2013.01); *H01L 2251/5369* (2013.01)

(58) Field of Classification Search
CPC ............. H01L 27/3246; H01L 27/3283; H01L 51/5268; H01L 51/5271; H01L 2251/5369
USPC ....................................... 257/40; 438/82, 99
See application file for complete search history.

(56) References Cited

U.S. PATENT DOCUMENTS

| | | | |
|---|---|---|---|
| 2012/0146062 A1* | 6/2012 | Oda | H01L 27/3211 257/88 |
| 2013/0010229 A1* | 1/2013 | Shin | G02F 1/1336 349/62 |
| 2014/0353630 A1* | 12/2014 | Baek | H01L 27/3262 257/40 |
| 2015/0255505 A1* | 9/2015 | Jeoung | H05K 1/189 257/89 |
| 2016/0293676 A1* | 10/2016 | Komatsu | H01L 27/3213 |
| 2017/0269435 A1* | 9/2017 | Yoon | G02F 1/133553 |

FOREIGN PATENT DOCUMENTS

| | | |
|---|---|---|
| JP | 6019992 B2 | 4/2014 |
| JP | 2016-0218151 A | 12/2016 |
| KR | 10-2012-0111912 A | 10/2012 |

* cited by examiner

*Primary Examiner* — Didarul A Mazumder
(74) *Attorney, Agent, or Firm* — Polsinelli PC

(57) ABSTRACT

A self-light emitting display device comprises at least one pixel including a first region and a second region; blue walls spaced apart from each other and dividing the first region and the second region to reflect and scatter blue light; a blue light-emitting layer configured to output the blue light and including a first blue light-emitting unit disposed between the blue walls in the first region, and a second blue light-emitting unit disposed between the blue walls in the second region; and a color conversion layer disposed over the blue light-emitting layer and including a green conversion unit disposed between the blue walls in the first region and configured to convert the blue light into green light, and a red conversion unit disposed between the blue walls in the second region and configured to convert the blue light into red light.

8 Claims, 5 Drawing Sheets

SELF-LIGHT EMITTING DISPLAY DEVICE

CROSS REFERENCE TO RELATED APPLICATION

This application claims priority to and the benefit of Korean Patent Application No. 10-2018-0118872 filed on Oct. 5, 2018, which is hereby incorporated by reference in its entirety.

BACKGROUND

Field of the Disclosure

The present disclosure relates to a self-light emitting display device.

Description of the Background

A display device is a device which can display data visually. In an information society, there is a growing need for various types of display devices which can display images. A liquid crystal display (LCD) device, and an organic light-emitting display (OLED) device have been widely used as a display device.

The organic light-emitting display device displays an image using an organic light-emitting diode which is a self-light emitting display device.

The organic light-emitting device converts electric energy into light energy using an organic material. In general, the organic light-emitting device has a structure in which an organic film is disposed between an anode and a cathode. When driving voltage is supplied between the anode and the cathode, holes are injected through the anode and electrons are injected through the cathode. When the holes and the electrons meet in the organic film, excitons are generated. When the state of the excitons is turned into a floor state, light is emitted.

The organic film has a structure in which layers consisting of different materials are stacked to enhance efficiency and safety of the organic light-emitting device. For instance, the organic film may include a hole injection layer, a hole transport layer, a light-emitting layer, an electron transport layer, an electron injection layer and the like.

SUMMARY

One aspect of the present disclosure is to provide a self-light emitting display device which may improve light extraction efficiency and may enhance a lifespan.

Another aspect of the present disclosure is to provide a self-light emitting display device which may reduce reflectivity and may not require a polarizer, thereby making it possible to reduce costs.

Problems that may be solved by the present disclosure are not limited to what has been described. Additionally, other problems that have not been mentioned may be clearly understood from the following description by one having ordinary skill in the art to which the disclosure pertains.

Aspects disclosed herein provide a self-light emitting display device that includes at least one pixel, a blue light-emitting layer that outputs blue light, blue walls that reflect and scatter blue light, and a color conversion layer.

At least one pixel includes a first region and a second region. The blue walls are spaced apart from each other and divide the first region and the second region. The blue light-emitting layer includes a first blue light-emitting unit and a second blue light-emitting unit. The first blue light-emitting unit is disposed between the blue walls in the first region, and the second blue light-emitting unit is disposed between the blue walls in the second region.

The color conversion layer is disposed above the blue light-emitting layer and includes a green conversion unit and a red conversion unit. The green conversion unit is disposed between the blue walls in the first region and converts blue light into green light, and the red conversion unit is disposed between the blue walls in the second region and converts blue light into red light.

The self-light emitting display device may further include a reflective layer reflecting the blue light to the color conversion layer. The reflective layer may include a first reflective unit and a second reflective unit. The first reflective unit may be disposed below the first blue light-emitting unit in the first region, and the second reflective unit may be disposed below the second blue light-emitting unit in the second region.

The self-light emitting display device may further include a selective transmitting layer which transmits the blue light and reflects the red light and the green light. The selective transmitting layer may include a first selective transmitting unit and a second selective transmitting unit. The first selective transmitting unit may be disposed between the first blue light-emitting unit and the green conversion unit, in the first region, and the second selective transmitting unit may be disposed between the second blue light-emitting unit and the red conversion unit, in the second region.

The self-light emitting display device may further include a color filter layer which absorbs blue light. The color filter layer may include a first color filter unit and a second color filter unit. The first color filter unit may be disposed above the green conversion unit in the first region, and the second color filter unit may be disposed above the red conversion unit in the second region.

Details of other aspects are included in the detailed description and the drawings.

The self-light emitting display device according to the present disclosure includes a selective transmitting layer which transmits blue light and reflects red light and green light, blue walls which reflect and scatter blue light, and a reflective layer. Accordingly, recycling of light may be enhanced by at least one of the selective transmitting layers, the blue walls and the reflective layer, thereby making it possible to increase light extraction efficiency and a lifespan of the self-light emitting display device.

Additionally, a color conversion layer disposed above a color conversion layer and absorbing external light may reduce reflectivity. Accordingly, the self-light emitting display device according to the present disclosure does not require a polarizer which is used to prevent reflection, thereby making it possible to reduce costs.

Effects of the present disclosure are not limited to the effects that have been described above. Additionally, various effects are included in the present disclosure.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain the principles of the disclosure.

In the drawings.

DETAILED DESCRIPTION

Figure 1:
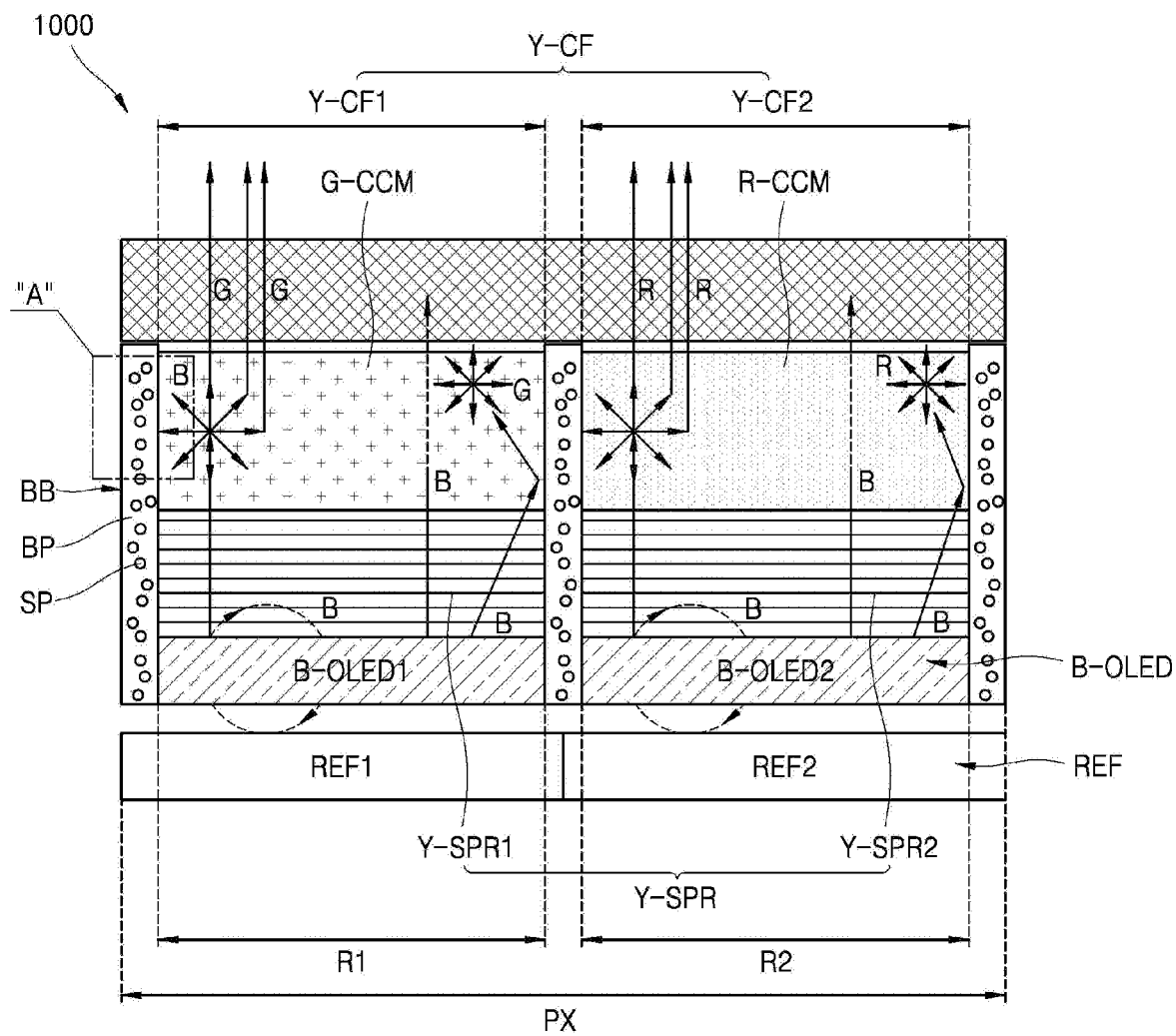
FIG. 1 is a schematic view illustrating a part of a self-light emitting display device according to an aspect of the present disclosure.

Advantages and features of the present disclosure, and methods for implementing the same may be understood clearly by reference to the following description of aspects and experimental examples together with the attached drawings. The attached drawings are provided so that the technical spirit of the present disclosure can be readily understood. Therefore, the technical spirit should not be construed as being limited to the attached drawings.

Additionally, the inventive subject matter may be embodied in various different forms. Accordingly, the disclosure should not be construed as being limited to what is disclosed below. Rather, what is disclosed below is presented so that the disclosure can be thorough and complete and can fully convey the scope of the inventive subject matter to one having ordinary skill in the art. The present disclosure should be defined only according to the scope of the appended claims.

Detailed description of relevant technologies that are publicly known may be omitted if it is deemed to make the gist of the present disclosure unnecessarily vague.

The terms "first", "second" and the like are used herein to describe various elements. However, the terms are used only to distinguish one element from another element. Thus, the elements should not be limited by the terms. Unless otherwise described, a first element may be a second element.

Throughout the specification, the singular forms "a", "an" and "the" are intended to include the plural forms as well, unless otherwise described.

Throughout the specification, the terms "including", and "having" should imply the inclusion of any other element but not the exclusion of any other element, unless otherwise described.

Throughout the specification, the terms "A and/or B" imply A, B, or A and B, and the terms "C to D" imply C or more and D or less, unless otherwise described.

When an element or a layer is referred to as being "on" another element or "on" another layer, an element or a layer may be "directly on" or "right on" another element or another layer, and a third element or a third layer may be interposed between an element and another element or between a layer and another layer. However, when an element or a layer is referred to as being "directly on" another element or another layer, or being "right on" another element or another layer, a third element or a third layer is not interposed between an element and another element or between a layer and another layer.

Spacial terms such as "below", "beneath", "lower", "above", "upper" and the like may be used to readily describe a relationship between one element or elements and another element or elements, as illustrated in the drawings. Additionally, the spacial terms should be interpreted as including different directions in which the elements are used or operate in addition to the directions in the drawings.

Below, the present disclosure is described with reference to the attached drawings.

Figure 2:
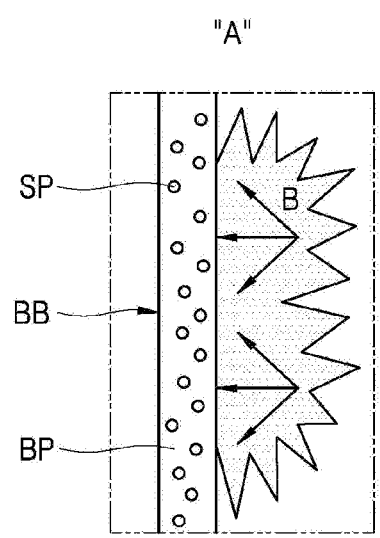
FIG. 2 is a schematic view illustrating region "A" in FIG. 1.

FIG. 1 is a schematic view illustrating a part of a self-light emitting display device 1000 according to an aspect, and FIG. 2 is a schematic view illustrating region "A" in FIG. 1 and schematically illustrates diffuse reflection or scattering of blue light (B) on surfaces of blue walls (BB).

Referring to FIGS. 1 and 2, the self-light emitting display device 1000 includes at least one pixel (PX), a blue light-emitting layer (B-OLED) which outputs blue light (B), blue walls (BB) which reflect and scatter blue light (B), and a color conversion layer (G-CCM, and R-CCM). At least one pixel (PX) includes a first region (R1) and a second region (R1), and the first region (R1) and the second region (R1) may be a green pixel region and a red pixel region respectively.

The blue walls (BB) are spaced apart from each other and divide the first region (R1) and the second region (R1). The blue walls (BB) include a blue photoresist (BP), and scatters (SP) which are diffused in the blue photoresist (BP). The blue photoresist (BP) includes pigment blue and a photosensitive resin. For instance, C.I. pigment blue 15, C.I. pigment blue 15:1, C.I. pigment blue 15:2, C.I. pigment blue 15:3, C.I. pigment blue 15:4, C.I. pigment blue 15:6, C.I. pigment blue 16, C.I. pigment blue 22, C.I. pigment blue 60, or C.I. pigment blue 64 and the like may be used as pigment blue. The publicly known scatters may be used as scatters (SP). The scatters (SP) are not restricted. For instance, titanium dioxide (TiO2) may be used as scatters (SP).

The blue light-emitting layer (B-OLED) includes a first blue light-emitting unit (B-OLED1) and a second blue light-emitting unit (B-OLED2). The first blue light-emitting unit (B-OLED1) and the second blue light-emitting unit (B-OLED2) are separated by the blue walls (BB). Specifically, the first blue light-emitting unit (B-OLED1) is disposed between the blue walls (BB) in the first region (R1), and the second blue light-emitting unit (B-OLED2) is disposed between the blue walls (BB) in the second region (R2).

The color conversion layer (G-CCM, and R-CCM) is disposed above the blue light-emitting layer (B-OLED) and includes a green conversion unit (G-CCM) and a red conversion unit (R-CCM) which are separated by the blue walls (BB). Specifically, the green conversion unit (G-CCM) is disposed between the blue walls (BB) in the first region (R1) and converts blue light (B) which is output from the first blue light-emitting unit (B-OLED1) into green light (G), and the red conversion unit (R-CCM) is disposed between the blue walls (BB) in the second region (R2) and converts blue light (B) which is output from the second blue light-emitting unit (B-OLED2) into red light (R).

The color conversion layer (G-CCM, and R-CCM) contains color conversion materials. The color conversion materials, for instance, may be quantum dots, fluorescent dyes or a combination thereof. The fluorescent dyes, for instance, include organic fluorescent materials, inorganic fluorescent materials, and a combination thereof.

The quantum dots may adjust wavelengths of emitted light simply by adjusting the size of the quantum dots, based on the quantum confinement effect. The quantum dot may be selected from II-VI compounds, III-V compounds, IV-VI compounds, IV elements, IV compounds and a combination thereof but may not be restricted. II-VI compounds may be selected from a group consisting of a binary compound which is selected from a group consisting of CdSe, CdTe, ZnS, ZnSe, ZnTe, ZnO, HgS, HgSe, HgTe, MgSe, MgS, and a combination thereof; a ternary compound which is selected from a group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary compound which is selected from a group consisting of HgZnTeS, CdZnSeS, CdZnSeTe, CdZnالسTe, CdHgSeS, CdHgSeTe, CdHgSTe, HgZnSeS, HgZnSeTe, HgZnSTe, and a combination thereof. III-V compounds may be selected from a group consisting of a binary compound which is selected from a group consisting of GaN, GaP, GaAs, GaSb, AlN, AlP, AlAs, AlSb, InN, InP, InAs, InSb, and a combination thereof; a ternary compound which is selected from a group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof; and a quaternary compound which is selected from a group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. IV-VI compounds may be selected from a group consisting of a binary compound which is selected from a group consisting of SnS, SnSe, SnTe, PbS, PbSe, PbTe, and a combination thereof; a ternary compound which is selected from a group consisting of SnSeS, SnSeTe, SnSTe, PbSeS, PbSeTe, PbSTe, SnPbS, SnPbSe, SnPbTe, and a combination thereof; and a quaternary compound which is selected from a group consisting of SnPbSSe, SnPbSeTe, SnPbSTe, and a combination thereof. IV elements may be selected from a group consisting of Si, Ge, and a combination thereof. IV compounds may be a binary compound which is selected from a group consisting of SiC, SiGe, and a combination thereof.

In this case, a particle may include a uniform concentration of the binary compound, the ternary compound, or the quaternary compound, or may include a different concentration of the binary compound, the ternary compound, or the quaternary compound. The Quantum dot may have a core/shell structure in which one quantum dot encircles another quantum dot. Interfaces of the core and shell may have a concentration gradient in which a concentration of elements becomes lower from the shell toward the core.

The quantum dot may have full width at half maximum (FWHM) of an emission spectrum, which ranges from about 30 nm to about 45 nm. In this range, color purity or color reproduction may improve. Additionally, light emitted through the quantum dot is released in all directions. Accordingly, a range of light viewing angles may be expanded.

Further, types of quantum dots are not restricted. Specifically, the quantum dots may be any one of sphere-shaped quantum dots, pyramid-shaped quantum dots, and multi-arm-shaped quantum dots, or may be any one of cube-shaped nano particles, nano tube-shaped particles, nano wire-shaped particles, nano fiber-shaped particles, nano plate-shaped particles and the like.

The fluorescent dyes, for instance, may be red fluorescent dyes, green fluorescent dyes, dyes emitting a third color light or a combination thereof. The red fluorescent dyes are a material which absorbs light in a range of green wavelengths and emits light in a range of red wavelengths. The red fluorescent dyes, for instance, may be at least one of (Ca, Sr, Ba)S, (Ca, Sr, Ba)2Si5N8, CaAlSiN3, CaMoO4, and Eu2Si5N8. The green fluorescent dyes are a material which absorbs light in a range of blue wavelengths and emits light in a range of green wavelengths. The green fluorescent dyes, for instance, may be at least one of yttrium aluminum garnet (YAG), (Ca, Sr, Ba)2SiO4, SrGa2S4, barium magnesium aluminate (BMA), α-SiAlON, β-SiAlON, Ca3Sc2Si3O12, Tb3Al5O12, BaSiO4, CaAlSiON, and (Sr1−xBax)Si2O2N2.

The self-light emitting display device 1000 may further include a selective transmitting layer (Y-SPR; yellow short path filter) which transmits blue light (B) and reflects light in a range of yellow. The selective transmitting layer (Y-SPR) transmits blue light (B) and reflects red light (R) and green light (G). The selective transmitting layer (Y-SPR) may include a first selective transmitting unit (Y-SPR1) and a second selective transmitting unit (Y-SPR2), which are separated by the blue walls (BB). The first selective transmitting unit (Y-SPR1) may be disposed between the first blue light-emitting unit (B-OLED1) and the green conversion unit (G-CCM) in the first region (R1), and the second selective transmitting unit (Y-SPR2) may be disposed between the second blue light-emitting unit (B-OLED2) and the red conversion unit (R-CCM) in the second region (R2).

The first selective transmitting unit (Y-SPR1) and the second selective transmitting unit (Y-SPR2) may have a structure in which a low-refractive-index layer and a high-refractive-index layer are alternately stacked. In the structure in which a low-refractive-index layer and a high-refractive-index layer are alternately stacked, optical interference where light of specific wavelengths are optionally reflected or transmitted may occur because of interference between layers. Red light (R) and green light (G) may be optionally reflected by adjusting a difference in the refractive indices of the low-refractive-index layer and the high-refractive-index layer, a difference in thicknesses of the low-refractive-index layer and the high-refractive-index layer, and the like.

The self-light emitting display device 1000 may further include a reflective layer (REF) which reflects blue light (B) to the color conversion layer (G-CCM, and R-CCM). The reflective layer (REF) may be disposed below the blue light-emitting layer (B-OLED) and may include a first reflective unit (REF1) and a second reflective unit (REF2). The first reflective unit (REF1) may be disposed below the first blue light-emitting unit (B-OLED1) in the first region (R1), and the second reflective unit (REF2) may be disposed below the second blue light-emitting unit (B-OLED2) in the second region (R2).

The first reflective unit (REF1) and the second reflective unit (REF2) may be made of metal. The first reflective unit (REF1) and the second reflective unit (REF2), for instance, may be the anode or the thin-film transistor which are disposed below the blue light-emitting layer (B-OLED). When the first reflective unit (REF1) and the second reflective unit (REF2) respectively consist of an anode, the first reflective unit (REF1) and the second reflective unit (REF2) may be separated by the blue walls (BB).

The first blue light-emitting unit (B-OLED1) releases blue light (B) in all directions, the blue light (B) is input to the green conversion unit (G-CCM) via the first selective transmitting unit (Y-SPR1), the green conversion unit (G-CCM) converts a part of the input blue light (B) into green light (G) and outputs the green light (G) to a first color filter unit (Y-CF1). Another part of the blue light (B) which is input to the green conversion unit (G-CCM) may be input to the first color filter unit (Y-CF1) as blue light (B) without being converted into green light (G).

The first reflective unit (REF1) recycles the blue light (B) which is released from the first blue light-emitting unit (B-OLED1) to the first reflective unit (REF1) and helps all the blue light (B) to be input to the green conversion unit (G-CCM), thereby making it possible to improve light extraction efficiency and color conversion efficiency of the self-light emitting display device 1000. Additionally, the blue walls (BB) serve as a waveguide such which the blue light (B) released from the first blue light-emitting unit (B-OLED1) is input to the green conversion unit (G-CCM), thereby making it possible to improve light extraction efficiency and color conversion efficiency of the self-light emitting display device 1000. The first selective transmitting unit (Y-SPR1) recycles the green light (G) which is output downward from the green conversion unit (G-CCM) toward the first selective transmitting unit (Y-SPR1) and helps all the green light (G) to be input to the first color filter unit (Y-CF1), thereby making it possible to improve light extraction efficiency and color conversion efficiency of the self-light emitting display device 1000.

Specifically, the blue light (B) which is released downward from the first blue light-emitting unit (B-OLED1) toward the first reflective unit (REF1) may hit the first reflective unit (REF1) and may reflect and then may be input to the first selective transmitting unit (Y-SPR1). The blue light (B) which is released from the first blue light-emitting unit (B-OLED1) toward the blue walls (BB) in both lateral directions may hit the blue walls (BB) on both sides of the first blue light-emitting unit (B-OLED1), may reflect and scatter, and then may be input to the first selective transmitting unit (Y-SPR1). The blue light (B) which is released from the first selective transmitting unit (Y-SPR1) toward the blue walls (BB) in both lateral directions may hit the blue walls (BB) on both sides of the first selective transmitting unit (Y-SPR1), may reflect and scatter, and then may be input to the green conversion unit (G-CCM).

Additionally, after input from the first selective transmitting unit (Y-SPR1) to the green conversion unit (G-CCM), the blue light (B) which is not converted into green light (G) in the green conversion unit (G-CCM) may hit the blue walls (BB) on both sides of the green conversion unit (G-CCM), may reflect and scatter, and then may be converted into green light (G) in the green conversion unit (G-CCM). The green light (G) which is released downward from the green conversion unit (G-CCM) toward the first selective transmitting unit (Y-SPR1) may hit the first selective transmitting unit (Y-SPR1) and may reflect toward the first color filter unit (Y-CF1).

The second blue light-emitting unit (B-OLED2) releases blue light (B) in all directions, the blue light (B) is input to the red conversion unit (R-CCM) via the second selective transmitting unit (Y-SPR2), the red conversion unit (R-CCM) converts a part of the input blue light (B) into red light (R) and outputs the red light (R) to a second color filter unit (Y-CF2). Another part of the blue light (B) which is input to the red conversion unit (R-CCM) may be input to the second color filter unit (Y-CF2) as blue light (B) without being converted into red light (R).

The second reflective unit (REF2) recycles the blue light (B) which is released from the second blue light-emitting unit (B-OLED2) and allows all the blue light (B) to be input to the red conversion unit (R-CCM), thereby making it possible to improve light extraction efficiency and color conversion efficiency of the self-light emitting display device 1000. Additionally, the blue walls (BB) serve as a waveguide such that the blue light (B) released from the second blue light-emitting unit (B-OLED2) is input to the red conversion unit (R-CCM), thereby making it possible to improve light extraction efficiency and color conversion efficiency of the self-light emitting display device 1000. The second selective transmitting unit (Y-SPR2) recycles the red light (R) which is output downward from the red conversion unit (R-CCM) toward the second selective transmitting unit (Y-SPR2) and allows all the red light (R) to be input to the second color filter unit (Y-CF2), thereby making it possible to improve light extraction efficiency and color conversion efficiency of the self-light emitting display device 1000.

Specifically, the blue light (B) which is released downward from the second blue light-emitting unit (B-OLED2) toward the second reflective unit (REF2) may hit the second reflective unit (REF2) and may reflect and then may be input to the second selective transmitting unit (Y-SPR2). The blue light (B) which is released from the second blue light-emitting unit (B-OLED2) toward the blue walls (BB) in both lateral directions may hit the blue walls (BB) on both sides of the second blue light-emitting unit (B-OLED2), may reflect and scatter, and then may be input to the second selective transmitting unit (Y-SPR2). The blue light (B) which is released from the second selective transmitting unit (Y-SPR2) toward the blue walls (BB) in both lateral directions may hit the blue walls (BB) on both sides of the second selective transmitting unit (Y-SPR2), may reflect and scatter, and then may be input to the red conversion unit (R-CCM).

Additionally, after input from the second selective transmitting unit (Y-SPR2) to the red conversion unit (R-CCM), the blue light (B) which is not converted into red light (R) in the red conversion unit (R-CCM) may hit the blue walls (BB) on both sides of the red conversion unit (R-CCM), may reflect and scatter, and then may be converted into red light (R) in the red conversion unit (R-CCM). The red light (R) which is released downward from the red conversion unit (R-CCM) toward the second selective transmitting unit (Y-SPR2) may hit the second selective transmitting unit (Y-SPR2) and may reflect toward the second color filter unit (Y-CF2).

The self-light emitting display device 1000 may further include a color filter layer (Y-CF) which optionally absorbs blue light (B). The color filter layer (Y-CF) includes a first color filter unit (Y-CF1) and a second color filter unit (Y-CF2). The first color filter unit (Y-CF1) is disposed above the green conversion unit (G-CCM) in the first region (R1), and the second color filter unit (Y-CF2) is disposed above the red conversion unit (R-CCM) in the second region (R2). The color filter layer (Y-CF), as illustrated, may be above the blue walls (BB) and may be a single film which includes the first color filter unit (Y-CF1) and the second color filter unit (Y-CF2). Though not illustrated, the color filter layer (Y-CF) may have a structure in which the first color filter unit and the second color filter unit are disposed respectively between the blue walls (BB) and are separated from each other.

The color filter layer (Y-CF) which includes the first color filter unit (Y-CF1) and the second color filter unit (Y-CF2) may include yellow dyes with low light stability and thermosetting resins. The yellow dyes with low light stability, for instance, may be azo-based yellow dyes. The color of the azo-based yellow dyes changes because of a change in the chemical structure when exposed to a fluorescent light source. The azo-based yellow dyes have light stability lower than that of dyes with another structure.

C.I. reactive yellow dyes may be an example of the azo-based yellow dyes. For instance, C.I. reactive yellow dyes may be C.I Reactive Yellow 1, 2, 3, 4, 5, 13, 14, 15, 16, 17, 18, 22, 23, 25, 35, 36:1, 37, 39, 42, 44, 45:1, 55, 57, 66, 72, 76, 78, 81, 84, 85, 86, 95, 105, 107, 121, 133, 135, 138, 143, 145, 148, 151, 154, 156, 157, 158, 160, 161, 162, 164, 167, 174, 176, 178, 179, 184, 185, 186, 193, 201, 202, 205, 206, 207, 208, 209, 210, 211, 212, 213 and the like but may not be restricted.

The first color filter unit (Y-CF1) absorbs blue light (B) which is not converted into green light (G) in the green conversion unit (G-CCM) among the light which is input via the green conversion unit (G-CCM), thereby making it possible to improve color purity of the self-light emitting display device 1000. The second color filter unit (Y-CF2) absorbs blue light (B) which is not converted into red light (R) in the red conversion unit (R-CCM) among the light which is input via the red conversion unit (R-CCM), thereby making it possible to improve color purity of the self-light emitting display device 1000.

Additionally, the color filter layer (Y-CF), as described below, may absorb external light and may improve visual sensitivity to reflection of the self-light emitting display device 1000.

Figure 3:
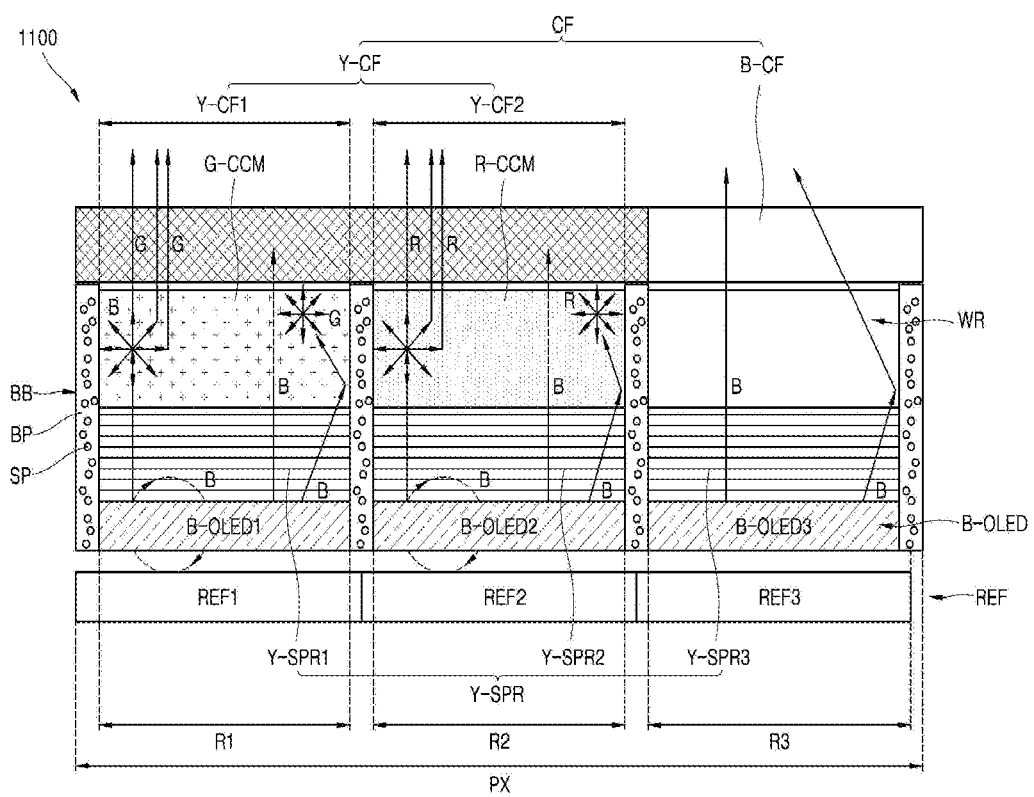
FIG. 3 is a schematic view illustrating a self-light emitting display device according to another aspect of the present disclosure.
Figure 4:
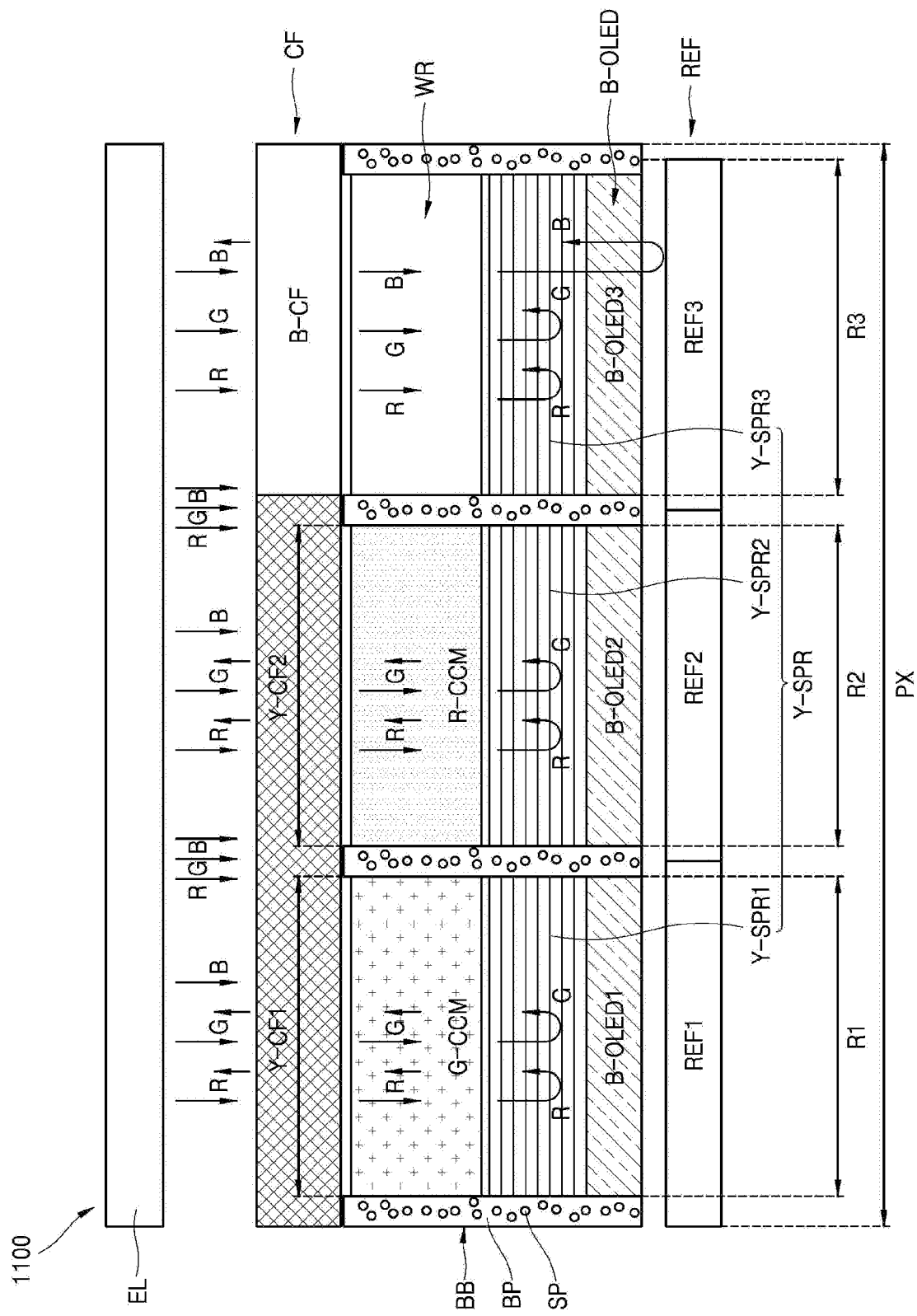
FIG. 4 is a schematic view illustrating a path of external light in the self-light emitting display device in FIG. 3.

FIG. 3 is a schematic view illustrating a self-light emitting display device 1100 according to another aspect, and FIG. 4 is a schematic view illustrating a path of external light in the self-light emitting display device 1100 in FIG. 3.

Referring to FIG. 3, there is a difference between the self-light emitting display device 1100 and the self-light emitting display device 1000. In the self-light emitting display device 1100, at least one pixel further includes a third region (R3). What has been described with reference to FIGS. 1 and 2 is omitted below.

The third region (R3) may be a blue pixel region and may be a region which outputs blue light (B) released from a third blue light-emitting unit (B-OLED3) out of the self-light emitting display device 1100. The blue light-emitting layer (B-OLED) includes the third blue light-emitting unit (B-OLED3) which releases blue light (B) in all directions, a third reflective unit (REF3), a third selective transmitting unit (Y-SPR3), a white resin layer (WR) and a blue light transmitting unit (B-CF).

The third blue light-emitting unit (B-OLED3) is disposed between the blue walls (BB) in the third region (R3). The reflective layer (REF) further includes the third reflective unit (REF3) which is disposed below the third blue light-emitting unit (B-OLED3). Blue light (B) which is output downward from the third blue light-emitting unit (B-OLED3) toward the third reflective unit (REF3) may reflect from the third reflective unit (REF3) and may be recycled to be output toward the blue light transmitting unit (B-CF).

The selective transmitting layer (Y-SPR) further includes the third selective transmitting unit (Y-SPR3). The third selective transmitting unit (Y-SPR3) is disposed in the third region (R3) and specifically, is disposed between the blue walls (BB) above the third blue light-emitting unit (B-OLED3). The third selective transmitting unit (Y-SPR3) may be omitted. In this case, the selective transmitting layer (Y-SPR) may consist of the first selective transmitting unit (Y-SPR1) and the second selective transmitting unit (Y-SPR2), and the third selective transmitting unit (Y-SPR3) may not exist in the third region (R3).

The color filter layer (CF) further includes the blue light transmitting unit (B-CF) which transmits blue light (B). Ultraviolet rays are radiated to a yellow photoresist which includes azo-based yellow dyes and photosensitive thermosetting resins. By doing so, the blue light transmitting unit (B-CF) may be formed. In the case of a color filter layer (CF) which consists of a single film, photoresist liquid which includes azo-based yellow dyes and photosensitive thermosetting resins is applied onto a substrate and is thermally cured, and then a thermally cured film may be formed. Then ultraviolet rays are radiated to the thermally cured film using a mask which is provided with a transmitting window only in a portion corresponding to the third region (R3). Accordingly, unlike the first color filter unit (Y-CF1) and the second color filter unit (Y-CF2), a blue light transmitting unit (B-CF) which does not have the capacity to absorb blue light (B) may be obtained.

A color conversion layer consists of a green conversion unit (G-CCM) and a red conversion unit (R-CCM). The green conversion unit (G-CCM) is disposed in the first region (R1) and specifically, is disposed between the blue walls (BB) and between the first selective transmitting unit (Y-SPR1) and the first color filter unit (Y-CF1). The red conversion unit (R-CCM) is disposed in the second region (R2) and specifically, is disposed between the blue walls (BB) and between the second selective transmitting unit (Y-SPR2) and the second color filter unit (Y-CF2). The white resin layer (WR) is disposed in the third region (R3) and is disposed between the blue walls (BB) and between the third selective transmitting unit (Y-SPR3) and the blue light transmitting unit (B-CF).

Referring to FIG. 4, among light which is output from an external light source (EL), blue light (B) may be absorbed in the first color filter unit (Y-CF1) and the second color filter unit (Y-CF2) and may pass through the blue light transmitting unit (B-CF). Among light which is output from an external light source (EL), red light (R) and green light (G) may pass through the first color filter unit (Y-CF1) and the green conversion unit (G-CCM) and then may be input to the first selective transmitting unit (Y-SPR1), and may be reflect by the first selective transmitting unit (Y-SPR1), may pass through the green conversion unit (G-CCM) and the first color filter unit (Y-CF1), and may be output outward. Additionally, among light which is output from an external light source (EL), red light (R) and green light (G) may pass through the second color filter unit (Y-CF2) and the red conversion unit (R-CCM) and may be input to the second selective transmitting unit (Y-SPR2), and may be reflect by the second selective transmitting unit (Y-SPR2), may pass through the red conversion unit (R-CCM) and the second color filter unit (Y-CF2) and may be output outward.

Red light (R), green light (G), and blue light (B) which are output from an external light source (EL) may pass through the blue light transmitting unit (B-CF), red light (R) and green light (G) may reflect from the third selective transmitting unit (Y-SPR3), and blue light (B) may reflect from the third reflective unit (REF3). The blue walls (BB) may absorb green light (G) and red light (R) among light (R, G, B) which is output from the external light source (EL).

The first color filter unit (Y-CF1) and the second color filter unit (Y-CF2) absorbs blue light (B) among light (R, G, B) which is output from the external light source (EL), and the blue walls (BB) absorb green light (G) and red light (R) which passes through the first color filter unit (Y-CF1) and the second color filter unit (Y-CF2). Thus, the self-light emitting display device 1100 may reduce external light reflectance and may not include a polarizer which is conventionally used to prevent reflection of external light (R, G, B), thereby making it possible to reduce costs.

Figure 5:
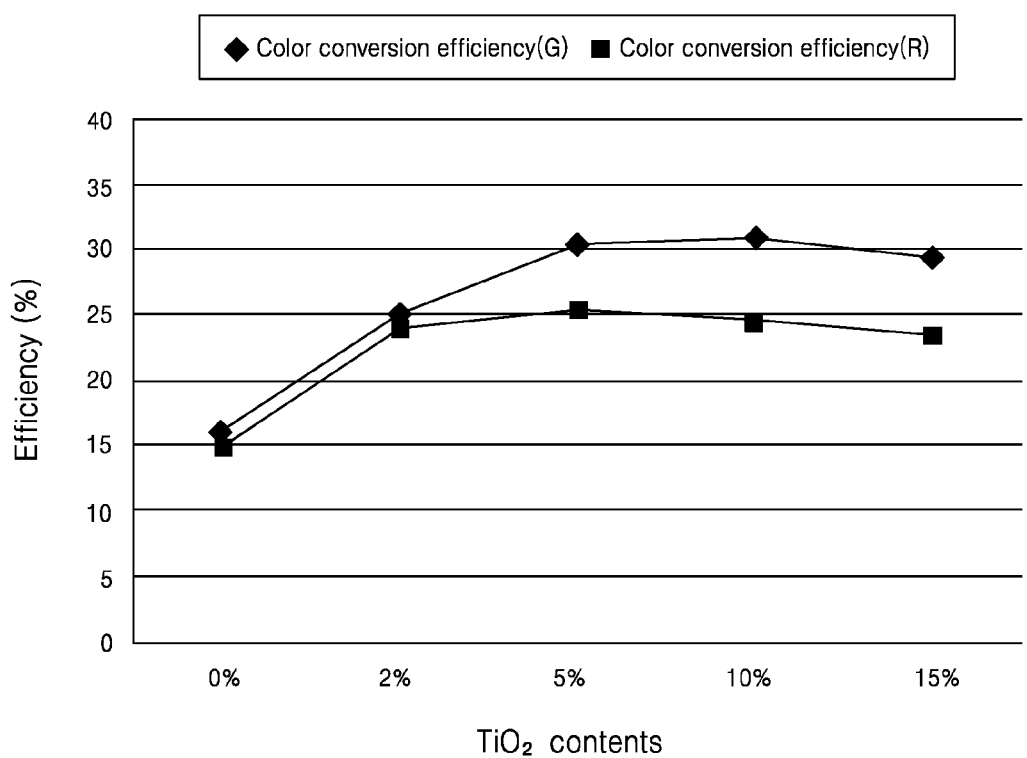
FIG. 5 is a view illustrating changes in color conversion efficiency (%) based on changes in concentrations of titanium dioxide (TiO2) when titanium dioxide (TiO2) is used as a scatter.

FIG. 5 is a view illustrating changes in color conversion efficiency (%) based on changes in concentrations of titanium dioxide (TiO2) when titanium dioxide (TiO2) is used as a scatter.

Referring to FIG. 5, when the blue walls (BB) included titanium dioxide (TiO2), color conversion efficiency of green light (G) and color conversion efficiency of red light (R) improved. Color conversion efficiency when titanium dioxide (TiO2) content was in a range of 2 wt % to 15 wt % was 50% or more greater than color conversion efficiency when titanium dioxide (TiO2) content was 0 wt %.

If color conversion efficiency of green light (G) was 100% in the case in which titanium dioxide (TiO2) content was 0 wt %, color conversion efficiency of green light (G) was approximately 150% in the case in which titanium dioxide (TiO2) content was 2 wt %. If color conversion efficiency of red light (R) was 100% in the case in which titanium dioxide (TiO2) content was 0 wt %, color conversion efficiency of red light (R) was approximately 153.33% in the case in which titanium dioxide (TiO2) content was 15 wt %.

TABLE 1

| Titanium dioxide (TiO$_2$) content (wt %) | Color conversion efficiency of green light (G) (%) | Remark |
|---|---|---|
| 0 wt % | 16% | 100.00% |
| 2 wt % | 24% | 150.00% |

TABLE 2

| Titanium dioxide (TiO$_2$) content (wt %) | Color conversion efficiency of red light (R) (%) | Remark |
|---|---|---|
| 0 wt % | 15 | 100.00% |
| 15 wt % | 23 | 153.33% |

The blue walls (BB) may contain 2 or more wt % of titanium dioxide (TiO2), or may contain 5 wt % to 15 wt % of titanium dioxide (TiO2) to improve color conversion efficiency of green light (G) as well as color conversion efficiency of red light (R), and may contain 5 wt % to 10 wt % of titanium dioxide (TiO2) to maximize color conversion efficiency of green light (G) as well as color conversion efficiency of red light (R).

The aspects have been described with reference to the attached drawings. However, the present disclosure is not limited to the aspects. The disclosure may be modified in various different forms on the basis of a combination of descriptions of each aspect. It will be apparent to those having ordinary skill in the art to which the present disclosure pertains that the disclosure may be implemented in other detailed forms without modifying the technical spirit and essential features of the disclosure. Therefore, it should be understood that the above-described aspects are provided only as examples and are not construed as being limited, in all aspects.

What is claimed is:

1. A self-light emitting display device, comprising:
   at least one pixel, each pixel including first, second and third regions adjacent to one another;
   blue walls spaced apart from each other, dividing the first, second and third regions and configured to reflect and scatter blue light;
   a blue light-emitting layer configured to output the blue light and including a first blue light-emitting unit disposed between the blue walls in the first region, a second blue light-emitting unit disposed between the blue walls in the second region and a third blue light-emitting unit disposed between the blue wall in the third region;
   a color conversion layer disposed over the blue light-emitting layer and including a green conversion unit disposed between the blue walls in the first region and configured to convert the blue light into green light, and a red conversion unit disposed between the blue walls in the second region and configured to convert the blue light into red light; and
   a white resin layer disposed between the blue walls in the third region and configured to transmit the blue light.

2. The self-light emitting display device of claim 1, further comprising a reflective layer configured to reflect the blue light to the color conversion layer,
   wherein the reflective layer includes:
   a first reflective unit disposed below the first blue light-emitting unit in the first region;
   a second reflective unit disposed below the second blue light-emitting unit in the second region; and
   a third reflective unit disposed below the third blue light-emitting unit in the third region.

3. The self-light emitting display device of claim 1, further comprising a selective transmitting layer configured to transmit the blue light and to reflect the red light and the green light,
   wherein the selective transmitting layer includes:
   a first selective transmitting unit disposed between the first blue light-emitting unit and the green conversion unit in the first region, and
   a second selective transmitting unit disposed between the second blue light-emitting unit and the red conversion unit in the second region.

4. The self-light emitting display device of claim 1, further comprising a color filter layer disposed above the color conversion layer and the white resin layer,
   wherein color filter layer includes:
   a first color filter unit disposed in the first region and configured to selectively absorb the blue light among the light which is input via the green conversion unit;
   a second color filter unit disposed in the second region and configured to selectively absorb the blue light among the light which is input via the red conversion unit; and
   a blue light transmitting unit disposed in the third region and configured to transmit the blue light.

5. The self-light emitting display device of claim 4, wherein
   the first color filter unit is disposed over the green conversion unit in the first region,
   the second color filter unit is disposed over the red conversion unit in the second region, and
   the blue light transmitting unit is disposed over the white resin layer in the third region.

6. The self-light emitting display device of claim 3, wherein the selective transmitting layer further includes a third selective transmitting unit disposed between the third blue light-emitting unit and the white resin layer in the third region.

7. The self-light emitting display device of claim 1, wherein the blue walls include a blue photoresist and scatters dispersed in the blue photoresist.

8. The self-light emitting display device of claim 7, wherein the blue photoresist includes pigment blue and photosensitive resin.

* * * * *